United States Patent [19]

Dingwall et al.

[11] 4,068,182

[45] Jan. 10, 1978

[54] DIRECT-COUPLED CASCADE AMPLIFIER WITH AUTOMATICALLY ADJUSTED QUIESCENT OUTPUT SIGNAL LEVEL

[75] Inventors: Andrew Gordon Francis Dingwall, Somerville; Bruce David Rosenthal, Randolph, both of N.J.

[73] Assignee: RCA Corporation, New York, N.Y.

[21] Appl. No.: 761,374

[22] Filed: Jan. 21, 1977

[51] Int. Cl.² .................. H03F 1/02; H03F 3/185; H03F 3/45

[52] U.S. Cl. ................................. 330/9; 330/51; 330/253; 330/261

[58] Field of Search ............... 330/9, 30 D, 35, 51, 330/69; 328/162

[56] References Cited

U.S. PATENT DOCUMENTS

| 3,237,116 | 2/1966 | Skinner et al. | 330/9 |
| 3,988,689 | 10/1976 | Ochi et al. | 330/9 |

OTHER PUBLICATIONS

Hellwarth et al., "Automatic Zero-Correction Amplifier", *IBM Technical Disclosure Bulletin* vol. 15, No. 1, June 1972, pp. 140-141.

*Primary Examiner*—James B. Mullins
*Attorney, Agent, or Firm*—H. Christoffersen; A. L. Limberg

[57] ABSTRACT

A cascade amplifier embodying the present invention includes a plurality of amplifier stages in direct-coupled cascade connection. During specified intervals interspersed with normal amplification equal potentials are imposed on the inverting and non-inverting terminals of the first amplifier stage. A direct-coupled feedback connection from the output port of the final amplifier stage to the input port of one of the amplifier stages succeeding the first includes a sample-and-hold circuit. This sample-and-hold circuit samples the signal level appearing at the output port of the final amplifier stage during said specified intervals and holds that level for the feedback connection during the intervening periods of normal amplification to provide continuing compensation against input offset potential error.

1 Claim, 4 Drawing Figures

DIRECT-COUPLED CASCADE AMPLIFIER WITH AUTOMATICALLY ADJUSTED QUIESCENT OUTPUT SIGNAL LEVEL

The present invention relates to the automatic adjustment of the quiescent output signal level of a direct-coupled cascade amplifier to a prescribed value for the condition where the inverting and non-inverting input terminals of the first stage of the cascade amplifier are held at equal potentials.

A problem that adversely affects the performance of a differential-input amplifier—e.g., an operational amplifier—is the departure of its output potential from design value under conditions when there is no difference in the potentials applied to its inverting and non-inverting input terminals. A certain potential termed the "input offset potential error" must be differentially applied between the amplifier input terminals to restore the output potential to design value, and a continuing design objective is to minimize the input offset potential error as much as possible. This has been attempted in the prior art using variable adjustments of bias conditions on portions of the differential input amplifier, but these methods are ill-suited for use in mass production. Automatic adjustments afforded by overall direct-coupled feedback from an output terminal of the amplifier to its inverting input terminal have been attempted, but they undesirably tend to reduce amplifier input impedance and to compromise the capability of the amplifier to accept large common-mode signals.

A cascade amplifier embodying the present invention includes a plurality of amplifier stages in direct-coupled cascade connection. During specified intervals interspersed with normal amplification, equal potentials are imposed on the inverting and non-inverting terminals of the first amplifier stage. A direct-coupled feedback connection from the output port of the final amplifier stage to the input port of one of the amplifier stages succeeding the first includes a sample-and-hold circuit. This sample-and-hold circuit samples the signal level appearing at the output port of the final amplifier stage during said specified intervals and holds that level for the feedback connection during the intervening periods of normal amplification to provide continuing compensation against input offset potential errors.

Figure 1:
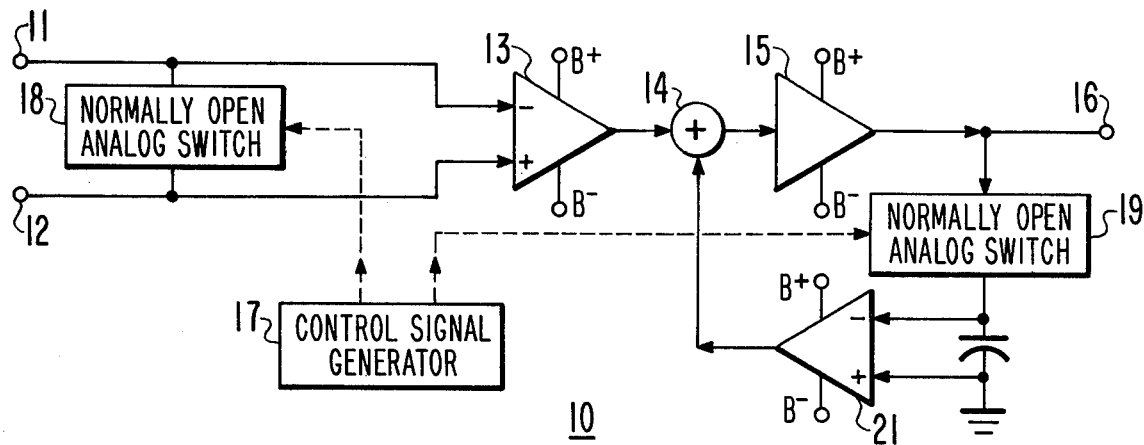
FIG. 1 is a block schematic of a direct-coupled cascade amplifier including, in accordance with the present invention, means to automatically adjust its quiescent output signal level.

The FIG. 1 cascade amplifier 10 has inverting and non-inverting input terminals 11 and 12, respectively, between which the input of a first portion 13 of cascade amplifier 10 is connected. The output of the first portion 13 of cascade amplifier 10 is direct coupled via an additive signal combining means 14 to the input of a second portion 15 of cascade amplifier 10, its output being direct coupled in turn to the output terminal 16 of cascade amplifier 10. Each of the portions 13 and 15 of cascade amplifier 10 may consist of either a single amplifier stage or a plurality of amplifier stages in direct coupled cascade. Cascade amplifier 10 is to be operated with output terminal 16 at a reference potential, assumed as ground, lying between the negative and positive operating potentials B— and B+, respectively, whenever input terminals 11 and 12 are at the same potential. There is an undesired tendency, however, for departure from this design criterion.

There is provision for recurring correction against this desired tendency. At selected times, a control signal generator 17 simultaneously generates first and second control signals. The first control signal renders normally non-conductive analog switch 18 conductive to clamp or short-circuit input terminals 11 and 12 together, causing them to be at equal potentials. For this condition, the output terminal 16 ideally should be at a prescribed quiescent potential equal to ground reference potential, but will probably tend to assume some other quiescent potential. The second control signal renders normally non-conductive analog switch 19 conductive to apply the potential at output terminal 16 to the floating plate of capacitor 20. So there is a tendency for output current from amplifier stage 15 to charge capacitor 20 to the quiescent potential. When analog switch 19 returns to its normally non-conductive state, the potential on the floating plate of capacitor 20 tends to be maintained at the value reached when analog switch 19 was last conductive. That is, analog switch 19 and capacitor 20 provide a sample-and-hold circuit, the potential at terminal 16 being sampled during the intervals analog switch 19 is conductive and the potential between the plates of capacitor 20 being held when analog switch 19 is non-conductive. The potential on the floating plate of capacitor 20 is compared against the reference potential, here shown as ground, by a voltage comparator amplifier 21, to develop an error signal. This error signal is additively combined in means 14 with the output signal from the first amplifier portion 13 of cascade amplifier 10. This error signal is accordingly applied to the input circuit of the second portion 15 of cascade amplifier 10 to complete a feedback loop in a sense to degenerate the error signal. The departure of the quiescent potential at output terminal 16 from its prescribed value, when the input terminals 11 and 12 are at signal potentials, will thus be reduced by the open-loop gain of the degenerative feedback loop. These operating conditions established by conduction of analog switches 18 and 19 force voltage comparator amplifier 21 to provide a signal that causes a response at output terminal 16 that counteracts the tendency for the quiescent potential appearing there to depart from prescribed value. By making the product of the gains of amplifiers 15 and 21 high—i.e., many times unity—substantial reduction of this departure can be achieved.

When analog switch 19 is in its normal non-conductive state, capacitor 20 continues to bias voltage comparator amplifier 21 to provide a signal that causes a response for offsetting the departure from prescribed quiescent potential that would otherwise appear in the output signal.

A number of variations of the FIG. 1 configuration are possible. Amplifier 15 may be made inverting rather than non-inverting, in which case the non-inverting and inverting terminals of voltage comparator amplifier 21 are reversed in their connection to capacitor 20 to preserve the degenerative nature of the recurrently established feedback loop around amplifier 15. Amplifier 21 may be dispensed with, the potential across capacitor 20 being applied directly to the means 14 for additively combining signal. One may alternatively place the amplifier 21 in cascade with analog switch 19 prior to storage capacitor 20, taking the feedback signal directly from across capacitor 20. Or amplifiers may appear in both the position shown and in cascade with analog switch 19.

By suitably biasing the portions 13 and 15 of cascade amplifier 10, one can cause the departure from prescribed quiescent potential that tends to appear at output terminal 16 to always be of the same polarity, so that amplifier 21 need only handle input signals of one polarity with respect to the reference potential. This permits simpler construction insofar as analog switch 19 and amplifier 21 are concerned.

The simple arrangement for imposing equal potentials on the inverting and non-inverting input terminals of first amplifier portion 13 shown in FIG. 1 serves well if the input signals applied to terminals 11 and 12 are supplied from reasonably high impedance sources as compared to the impedance offered between terminals 11 and 12 by analog switch 18 when conductive. If the input signals supplied to terminals 11 and 12 are from low impedance sources, comparable in impedance to the impedance offered between terminals 11 and 12 by analog switch 18 when conductive, means must be provided for decoupling terminals 11 and 12 from the inverting and non-inverting input terminals of amplifier portion 13 while analog switch 18 short-circuits them.

Figure 2:
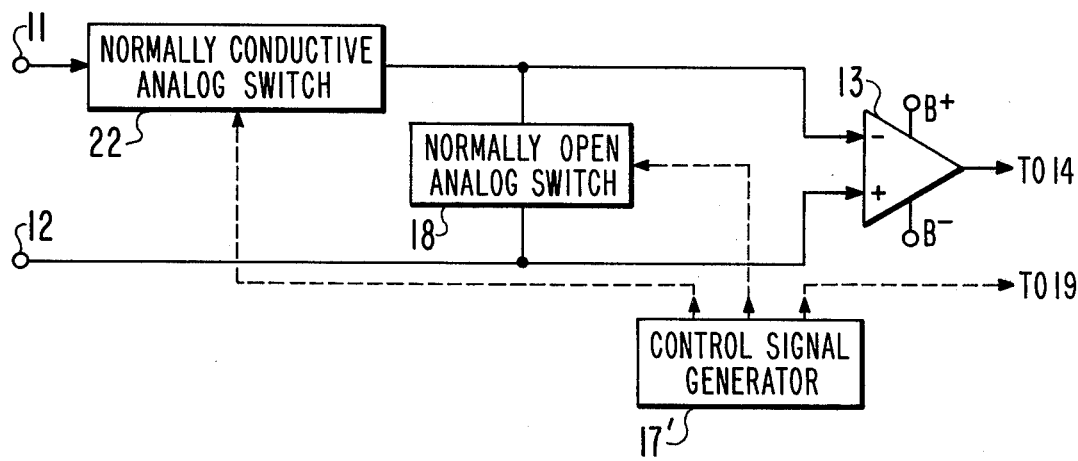
FIGS. 2 and 3 are block schematics of modifications of the FIG. 1 apparatus in accordance with further aspects of the present invention.

FIG. 2 shows a normally conductive analog switch 22 connecting terminal 11 to the inverting input terminal of amplifier portion 13. Analog switch 22 is receptive of a control signal from control signal generator 17' for rendering analog switch 22 non-conductive when analog switch 18 is conductive.

Figure 3:
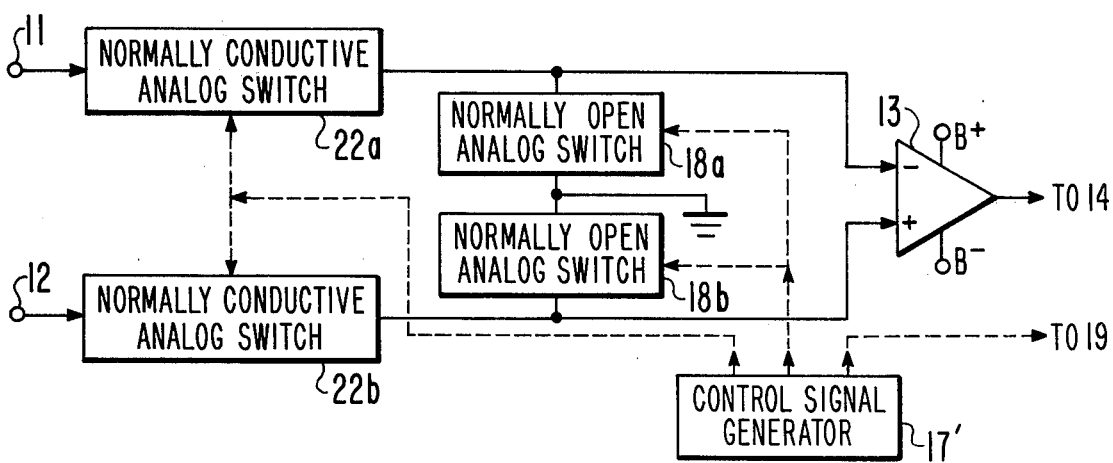

FIG. 3 shows an alternative connection to that of FIG. 2 for operation balanced-against-ground. Responsive to control signals from control signal generator 17', normally non-conductive analog switches 18a and 18b become conductive to short-circuit the inverting and non-inverting input terminals respectively of amplifier portion 13 to the same potential (shown as ground), and normally conductive analog switches 22a and 22b become non-conductive to decouple terminals 11 and 12 from the inverting and non-inverting terminals respectively of amplifier portion 13.

Figure 4:
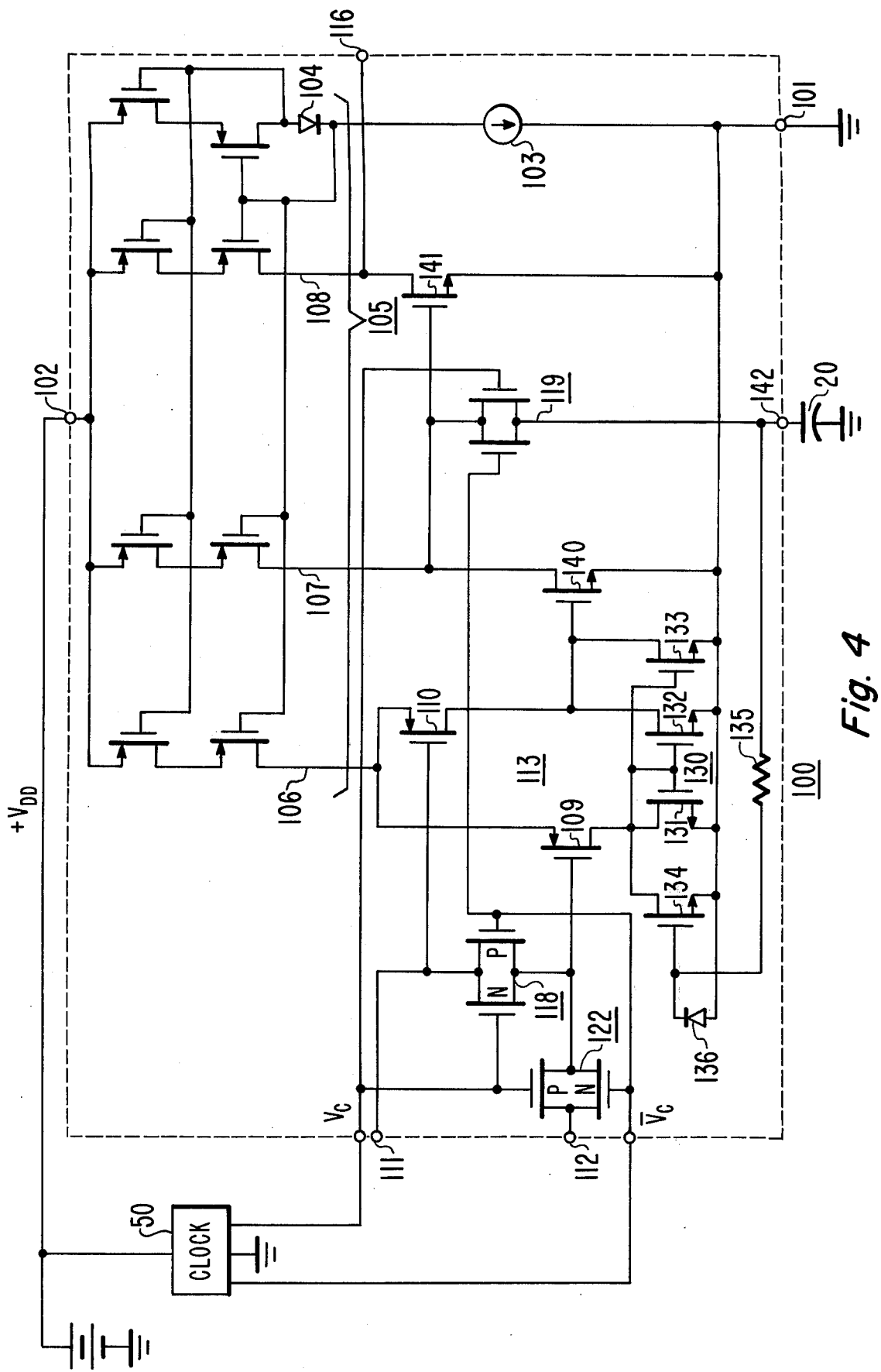
FIG. 4 is a full schematic of a direct-coupled cascade amplifier used as a level comparator, which in accordance with the present invention includes means to automatically adjust its quiescent output signal level.

FIG. 4 shows a level comparator 100 designed for inclusion in a digital-to-analog converter of the successive approximations type, which converter is constructed in complementary metal-oxide-semiconductor integrated circuit form. A reference potential, shown as ground, and an energizing potential $+V_{DD}$ are applied respectively to terminal 101 and to terminal 102. A clock circuit 50, which may be integrated together with level comparator 100 rather than being separate therefrom as shown in FIG. 4, applies clock potentials $V_C$, $\overline{V}_C$ as control signals to transmission gates 118, 119, 122. Normally, $V_C$ and its complement $\overline{V}_C$ are of such value and relative polarity that transmission gates 118 and 119 are open circuited and transmission gate 122 is short-circuited. During this normal operating mode input signals appearing on terminals 111 and 112 are applied to the differential-input input amplifier stage 113.

Constant-current generator 103 withdraws a bias current from the input node 104 of a current mirror amplifier (CMA) 105. CMA 105 has its common mode connected to $+V_{DD}$ at terminal 102 and has output nodes 106, 107 and 108 which provide respective currents each proportionally related to the input current demanded by constant current generator 103. CMA 105 is a plural-output version of the CMA described by Otto Schade, Jr., in U.S. Pat. No. 3,953,807 issued Apr. 27, 1976, and entitled "Current Amplifier." Current from node 106 is applied to the joined source electrodes of transistors 109 and 110, which have their respective base electrodes coupled to receive input signals from input terminals 111 and 112 under normal operating conditions. The differential components of these input signals operate to change the relative degrees of conduction in transistors 109 and 110.

The drain currents of transistors 109 and 110, which are thus modulated in push-pull, are differentially combined in a CMA 130 to provide gate drive to a common-source transistor 140, which is provided constant quiescent drain current from output node 107 of CMA 105. Transistor 140 responds with drain current change applied to the gate electrode of a further common-source transistor 141, which is provided constant quiescent drain current from output node 108 of CMA 105. Transistor 141 responds with drain current change available at output terminal 116.

CMA 130 includes the usual input transistor 131, self-biased to adjust its conduction to accept applied drain current, and the usual output transistor 132, having the source-to-gate potential of the input transistor applied as its source-to-gate potential to cause conduction in the two transistors in the same ratio as their relative transconductances. CMA 130 also includes a further output transistor 133 in parallel with its output transistor 132. Conduction of transistor 133 tends to reduce the gate potential of common-source amplifier transistor 140 and so tends to cut off drain current flow in transistor 140, biasing the drain electrode of transistor 140 and the gate electrode of transistor 141 more positively than desired.

At specified intervals, clock potentials $V_C$ and $\overline{V}_C$ are reversed in relative polarity to place the circuit in its "zero-adjust" mode. In this mode, transmission gate 122 is open-circuited and transmission gate 118 is short-circuited to apply identical gate potentials to transistors 109 and 110. At the same time, transmission gate 119 is short-circuited to apply the drain potential of transistor 140 to terminal 142 connected to the floating plate of capacitor 20. The tendency for the gate potential of transistor 141 to be more positive than desired is counteracted by this potential being direct-coupled to the gate of transistor 134 to increase its conduction. The increased conduction of transistor 134 diverts an increased portion of the drain current of transistor 109 to transistor 134, reducing the portion of this drain current transistor 131 is called upon to conduct by its drain-to-gate feedback. The resulting reduced source-to-gate potential that the feedback maintains for transistor 131 applied between the source and gate electrodes of transistor 132, results in reduced conduction of transistor 132. The gate electrode of transistor 140 thus tends to become more positive responsive to the drain current of transistor 110, tending to increase the conduction of transistor 140 and thus make its drain potential less positive.

Transmission gate 119 and capacitor 20 operate as a sample-and-hold circuit, charge being retained on capacitor 20 during the normal operating mode when transmission gate 119 is open-circuited. The gate potential of transistor 141 tends to be stabilized at that value of the source-to-gate potential of transistor 134 as causes its conduction to be related to the conduction of transistor 131 in the same way as the conduction of transistor 133 is related to the conduction of transistor 133. Thus the conduction of transistor 141 vis-a-vis that of transistor 134 in the equilibrium state can be determined by their relative geometries.

Series resistor 135 and shunt diode 136, which diode is normally non-conductive, are shown included in the direct coupling network which applies the potential across capacitor 20 between the source and gate electrodes of transistor 134. Diode 136 exhibits reverse-breakdown if the potential at terminal 142 becomes positive enough; this is done to protect transistor 134 from excessive source-to-gate potentials.

As will be apparent to one skilled in the art of integrated circuit design, the parallel transistors 132 and 133 may be replaced by a single equivalent transistor.

What is claimed is:

1. Direct-coupled cascade amplifier with automatically adjusted quiescent output potential comprising:

inverting and non-inverting input signal terminals;

an output signal terminal;

a reference terminal for application of reference potential;

first and second transistors of a first conductivity type, and third and fourth and fifth and sixth transistors of a second conductivity type complementary to said first conductivity type, each of said transistors having first and second electrodes with a principal controlled-conduction path therebetween and having a control electrode, the potential of which respective to its first electrode determines the conductivity of its principal controlled-conduction path;

means connecting said first and said second transistors in long-tailed pair configuration, including means applying a quiescent current to an interconnection between the first electrodes of said first and said second transistors;

means connecting said third and fourth transistors in a differential current combining circuit, including means connecting the first electrodes of each of said third and said fourth transistors to said reference terminal, including a first node to which the second electrodes of said first and said third transistors are direct-current conductively connected, including a second node to which the second electrodes of said second and said fourth transistors are direct-current conductively connected and from which differentially combined current is available, and including means for applying substantially the same potential to the control electrodes of said third and said fourth transistors including means direct coupling said first node to the control electrode of said third transistor to complete a degenerative feedback connection between the second and control electrodes of said third transistor;

means connecting said fifth transistor for amplifier operation, including direct coupling of said second node to the control electrode of said fifth transistor, including means connecting the first electrode of said fifth transistor to said reference terminal, including means for supplying quiescent current to the second electrode of said fifth transistor direct coupled to said output signal terminal;

a capacitor having a first end connected to a point of fixed potential relative to said reference potential and having a second end direct coupled to the control electrode of said sixth transistor;

means connecting the first electrode of said sixth transistor to said reference terminal;

means direct current conductively connecting the second electrode of said sixth transistor to said first node;

means for applying the potentials appearing at said inverting and said non-inverting input signal terminals respectively to the control electrode of said first transistor and to the control electrode of said second transistor during a normal mode of operation;

means for applying the same potential to the control electrodes of each of said first and said second transistors during a zero-adjust mode of operation interspersed with said normal mode of operation; and means for direct coupling the potential at the second electrode of said fifth transistor to the second end of said capacitor only during said zero-adjust mode of operation.

* * * * *